US007372316B2

(12) United States Patent
Chatterjee et al.

(10) Patent No.: US 7,372,316 B2
(45) Date of Patent: May 13, 2008

(54) TEMPERATURE COMPENSATED REFERENCE CURRENT GENERATOR

(75) Inventors: Kallol Chatterjee, Calcutta (IN); Samala Sreekiran, New Delhi (IN)

(73) Assignee: STMicroelectronics Pvt. Ltd., Noida (IN)

( * ) Notice: Subject to any disclaimer, the term of this patent is extended or adjusted under 35 U.S.C. 154(b) by 0 days.

(21) Appl. No.: 11/286,276

(22) Filed: Nov. 22, 2005

(65) Prior Publication Data

US 2006/0164151 A1 Jul. 27, 2006

(30) Foreign Application Priority Data

Nov. 25, 2004 (IN) ........................ 2373/DEL/2004

(51) Int. Cl.
*H03K 3/42* (2006.01)

(52) U.S. Cl. ...................................... 327/513; 327/530

(58) Field of Classification Search ................ 327/512, 327/530, 538–543, 513; 323/312–317
See application file for complete search history.

(56) References Cited

U.S. PATENT DOCUMENTS

| | | | | |
|---|---|---|---|---|
| 5,103,159 | A * | 4/1992 | Breugnot et al. | 323/315 |
| 5,243,231 | A * | 9/1993 | Baik | 327/544 |
| 5,798,669 | A | 8/1998 | Klughart | 327/539 |
| 5,864,230 | A | 1/1999 | Dondale | 323/312 |
| 6,144,250 | A | 11/2000 | Owen et al. | 327/549 |
| 6,150,871 | A * | 11/2000 | Yee | 327/538 |
| 6,188,270 | B1 * | 2/2001 | Boerstler | 327/543 |
| 6,222,399 | B1 * | 4/2001 | Imbornone et al. | 327/143 |
| 6,404,252 | B1 | 6/2002 | Wilsch et al. | 327/198 |
| 6,448,844 | B1 | 9/2002 | Cho | |
| 6,492,795 | B2 * | 12/2002 | Engl | 323/312 |
| 6,737,909 | B2 * | 5/2004 | Jaussi et al. | 327/541 |
| 6,765,431 | B1 * | 7/2004 | Coady | 327/539 |
| 6,919,753 | B2 * | 7/2005 | Wang et al. | 327/513 |
| 6,946,896 | B2 * | 9/2005 | Behzad | 327/512 |
| 6,972,550 | B2 * | 12/2005 | Hong | 323/315 |
| 7,071,670 | B1 * | 7/2006 | Hidri et al. | 323/313 |
| 7,119,527 | B2 * | 10/2006 | Fernald | 323/315 |
| 7,123,081 | B2 * | 10/2006 | Lyon | 327/543 |
| 7,157,894 | B2 * | 1/2007 | Fulton et al. | 323/315 |
| 2004/0066180 | A1 | 4/2004 | Harrison | 323/312 |

FOREIGN PATENT DOCUMENTS

WO WO-2004023520 3/2004

* cited by examiner

*Primary Examiner*—N. Drew Richards
*Assistant Examiner*—Thomas J. Hiltunen
(74) *Attorney, Agent, or Firm*—Gardere Wynne Sewell LLP

(57) ABSTRACT

A first order temperature compensated reference current generator includes a current device providing a controlled current, a startup circuit connected to the current device for initiating operation of the current device, and a current definition mechanism driven by the current device for supplying a current which is independent of temperature, process and individual temperature coefficients circuit elements used. The current definition mechanism incorporates voltage controlled resistors driven by a predetermined voltage and having a predetermined temperature coefficient.

16 Claims, 4 Drawing Sheets

*FIG. 1*
*(PRIOR ART)*
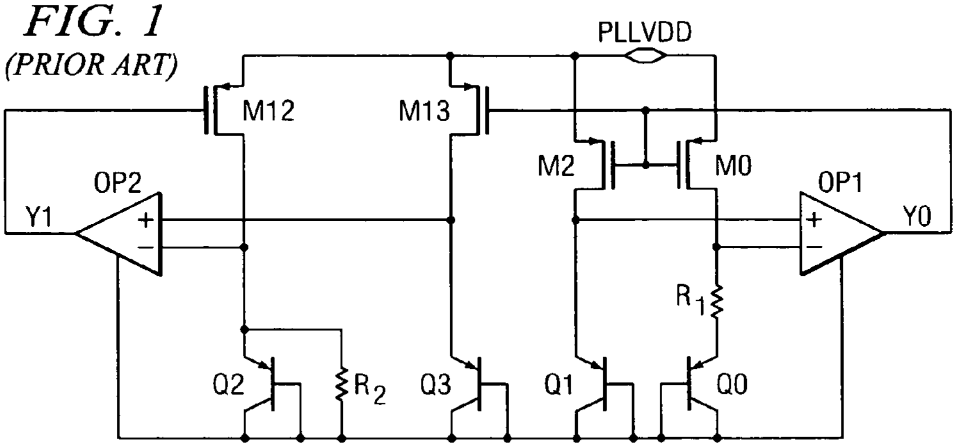
*FIG. 2*
*(PRIOR ART)*
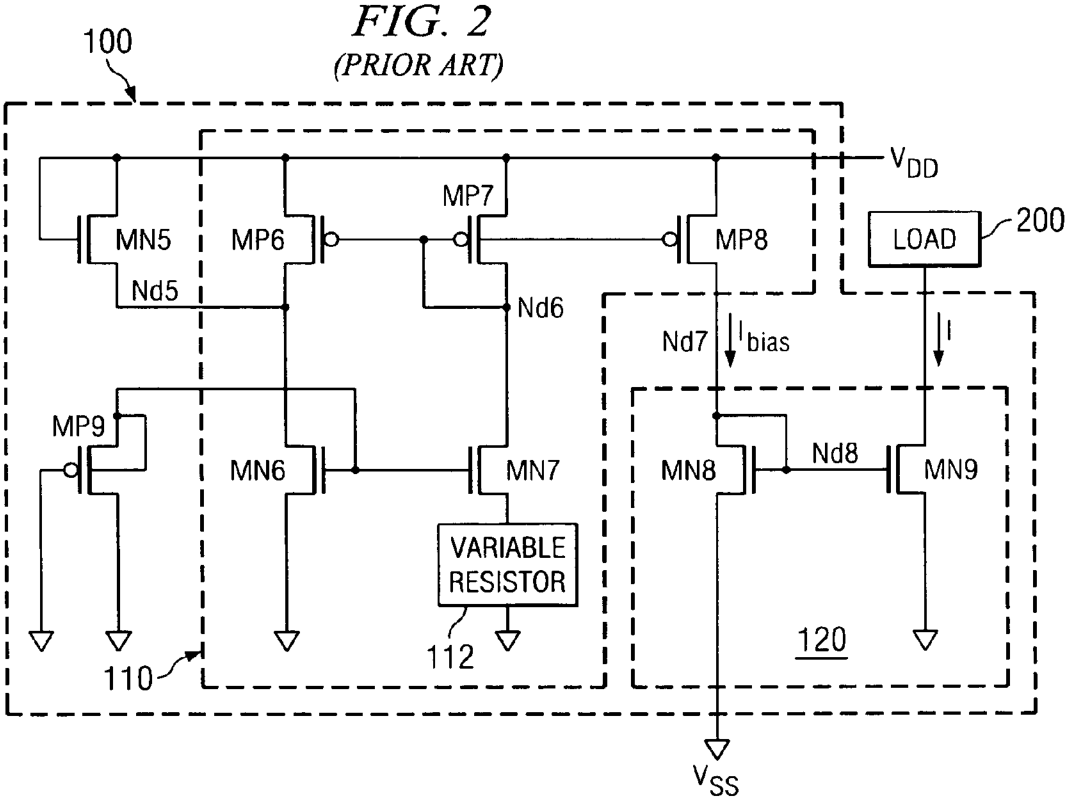
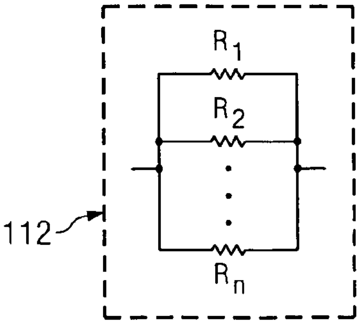
*FIG. 2a*

TEMPERATURE COMPENSATED REFERENCE CURRENT GENERATOR

PRIORITY CLAIM

The present application claims priority from Indian Patent Application No. 2373/Del/2004 filed Nov. 25, 2004, the disclosure of which is hereby incorporated by reference.

BACKGROUND OF THE INVENTION

1. Technical Field of the Invention

The present invention relates to a reference current generator. More particularly, the invention relates to a first order temperature compensated, and process corner and power supply independent, reference current generator for low voltage applications in CMOS technology.

2. Description of Related Art

A current reference is normally obtained from a bandgap reference circuit as shown in FIG. 1. A bandgap circuit generally has diode-connected Bipolar Junction Transistors (BJTs) Q0, Q1, Q3 and Q4 connected in parallel to each other. BJT Q0 is provided with a series connected resistor R1, whereas BJT Q4 is provided with a resistor connected in parallel to achieve a current summing function. A current device comprising transistors M1, M2, M12 and M13 causes a similar current to flow through each of these BJTs. An operational amplifier OP1 receives input from BJTs Q0 and Q1 as shown. The output Y0 of the operational amplifier OP1 is connected to the control terminals of current devices M1, M2 and M13 for regulating the current supplied by the device. Another operational amplifier OP2 is connected to the emitters of BJTs Q2 and Q3. The output Y1 of this operational amplifier is connected to the control terminal of transistor M12. The function of this arrangement is to maintain the input nodes of operational amplifiers OP1 and OP2 at same voltage level. The output current I can be than be mirrored from this circuit.

The current equation for this circuit can be written as $$I=(V_t*\ln(n)/R1)+V_{be}/R2$$

where, $V_t$ is the thermal voltage (26 mV at 300 deg K); $V_{be}$ is the base emitter voltage drop of a BJT; and n is the emitter area ratio of BJTS Q0 and Q1.

The current I is temperature compensated to the first order as both $V_t$ and $V_{be}$ have inverse temperature dependencies, however an approximately +/−20% variation of this current is observed across process, voltage and temperature (PVT).

The minimum supply voltage required for a typical 90 nm process, is the voltage drop across base emitter voltage drop of the BJT $V_{be}$ (typically 0.65V) plus the threshold voltage of the Metal Oxide Semiconductor Field Effect Transistors (MOSFETs) $V_{th}$ (approximately 0.25V) plus twice the drop across drain to source voltage for a MOSFET to operate in saturation $V_{ds}$(sat). Mathematically this minimum supply voltage Vdd required can be written as:

$$Vdd(\min)=V_{be}+V_{th}+2*V_{ds}(\text{sat})$$

From the above discussion it is apparent that a substantial voltage drop is observed across the BJTs. For low voltage applications having supply voltage of about 1 Volt this poses a serious limitation as the voltage headroom available for the MOS to operate in saturation is almost unavailable or is so small that the required sizes of the MOS transistors become very large. This increases the parasitics associated with the MOS transistors. Further as each MOS transistor is expected to operate at the edge of saturation the output resistance of the MOS transistor is very small and the overall performance of the circuit is affected. Therefore reliability of this circuit for low voltage applications is very low.

U.S. Pat. No. 6,448,844, the disclosure of which is hereby incorporated by reference, describes another CMOS current reference 100 shown in FIG. 2. This circuit includes a constant current generating unit 110 for generating a current that is proportional to absolute temperature (PTAT) that does not depend on the supply voltage VDD. Further the invention includes a self-compensation unit MP9 for controlling the constant current generating unit 110 to maintain the constant current regardless of the variation in temperature. The CMOS current reference circuit also includes a starting circuit unit MN5 for establishing a current path to activate the constant current generating unit 110 and a constant current outputting unit 120 for supplying the bias current Ibias generated from the constant current generating unit 110. A variable resistor 112 is coupled between the drain of the NMOS transistor MN7 and ground VSS. In order to prevent the output bias current $I_{bias}$ from varying due to process variations, a variable resistor 112 comprising of a plurality of parallel resistors R1, R2 . . . , Rn is provided to adjust the resistance value depending on the process variation as shown in FIG. 2*a*.

An expression for the current I generated by circuit in FIG. 2 can be derived by assuming transistor MN5 carries negligible current. Transistors MP6 and MP7 form a current mirror. It is assumed that the equivalent resistance of the variable resistor is R and the currents in transistors MN6B and MP9 are I1 and I2 respectively. The resistor 112 is coupled between the drain of the NMOS transistor MN7 and VSS. For the purpose of derivation of the relationship the following parameter definitions are used:

$V_t$=thermal voltage (26 mv at 300 deg K);

$V_{be}$=base emitter voltage drop of the BJT;

$V_{gs}$=gate to source voltage of a MOS;

$V_{ds}$=drain to source voltage of a MOS;

$\kappa_n$=transconductance parameter of a NMOS;

$\kappa_p$=transconductance parameter of a PMOS;

$\mu_n$=surface mobility of electrons in a NMOS;

$\kappa_p$=surface mobility of electrons in a PMOS;

$V_{th}$=threshold voltage of a MOS;

$C_{ox}$=gate oxide capacitance per unit area of a MOS;

$g_m$=small signal transconductance of a MOS;

$r_{ds}$=small signal output resistance of a MOS;

W/L=Width Vs Length ratio of a transistor;

wherein:

$$V_{gsMN6B}=V_{sgMP9}=V_{gsMN7}+I*R$$

$$V_{gsMN6B}=\sqrt{2*I1/\beta_{MN6B}}+V_{thn}$$

$$\text{where } \beta_{MN6B}=\kappa_n(T)*(W/L)_{MN6B}$$

$$\kappa_n(T)=\mu_n(T)*C_{ox}$$

$$\mu_n(T)=\mu_{n0}*T^{(-3/2)}$$

$$V_{sgMP9}=\sqrt{2*I2/\beta_{MP9}}+V_{thp}$$

$$\text{where } \beta_{MP9}=\kappa_p(T)*(W/L)_{MN6B}$$

$$\kappa_p(T)=\mu_p(T)*C_{ox}$$

$$V_{gsMN7}=\sqrt{2*I/\beta_{MN7}}+V_{thn}$$

Assuming that the threshold voltages for the n and p type MOS transistors are the same, that is:

$$V_{thn}=V_{thp}$$

The following expression is obtained:

$$I=(2/R^2*(\beta_{MN6B}+\beta_{MP9}))*(1-\sqrt{}(\beta_{MN6B}+\beta_{MP9})/(\beta_{MN7}))^2$$

From the above equation it is evident that the current I is first order compensated only if the resistance used has a positive temperature coefficient. For a particular process both positive temperature coefficient and negative temperature coefficient resistances would be available and to get a first order compensated current using 100 a positive temperature coefficient resistance has to be chosen. Normally in a particular process negative temperature coefficient resistances exhibit less variation across the process corners than the positive temperature coefficient resistances. A positive temperature coefficient resistance results in a large variation of current across process corners.

The circuit also exhibits poor supply rejection and hence current variation with supply voltage. The start up transistor MN5 is not switched off during steady state operation leading to a offset in the values of the currents in the two branches of the constant current generating unit 110 and to increased dependence of the current on the supply voltage. Also there is a potential short circuit path from VDD to VSS formed by MN5 and MP9 leading to large power dissipation.

There is accordingly a need to obviate the above and other drawbacks in the prior art.

SUMMARY OF THE INVENTION

An embodiment of the present invention provides an improved first order temperature compensated current reference generating circuit comprising: a current device connected to the supply for providing a controlled current; a startup circuit connected to said current device for initiating operation of said current device, and a current dictating mechanism driven by said current device for supplying a current which is independent of temperature, process and individual temperature coefficients circuit elements used; wherein said current dictating mechanism has resistive device controlled by a predetermined voltage having a predetermined temperature coefficient.

The current device may comprise a current mirror circuit having a plurality of transistors with common control terminals and one of the conducting terminals connected to the supply.

The start up circuit may be connected to said first common control terminal of said plurality of transistors for providing a signal for a duration sufficient enough to initiating circuit operation.

The current dictating mechanism may include first and second transistors both having common control terminals connected to the first conducting terminal of said first transistor and first conducting terminals of the first and second transistors are driven by the current device, second conducting terminal of said first transistor is connected to the ground and second conducting terminal of said second transistor is connected to the ground through a resistive device controlled by a predetermined voltage having a predetermined temperature coefficient.

The resistive device may comprise a transistor.

The predetermined voltage may comprise a voltage signal sufficient enough to keep the resistive device linearly resistive and said predetermined temperature coefficient may comprise a positive temperature coefficient.

The circuit further comprises a differential amplifier providing its output to the common control terminals of said plurality of transistors for ensuring a current flowing through said transistors such their second conducting terminals of these transistors are at same voltage level, the input terminals of the differential amplifier connected to second conducting terminals of said plurality of transistors to detect a voltage difference thereby providing an improved power supply rejection ratio.

According to another aspect of the invention an improved first order temperature compensated current reference generating module having a PTAT circuit has a voltage with a predetermined temperature coefficient connected to an amplifier for lifting said voltage to a predetermined level. This is connected to a current generating circuit comprising: a current device connected to the supply for providing a controlled current; a startup circuit connected to said current device for initiating operation of said current device, and a current dictating mechanism driven by said current device for supplying a current which is independent of temperature, process and individual temperature coefficients circuit elements used; wherein said current dictating mechanism has resistive device that receives said predetermined voltage having a predetermined temperature coefficient from the amplifier.

The current device may comprise a current mirror circuit having a plurality of transistors with common control terminals and one of the conducting terminals connected to the supply.

The start up circuit may be connected to said first common control terminal of said plurality of transistors for providing a signal for a duration sufficient enough to initiating circuit operation.

The current dictating mechanism may include first and second transistors both having common control terminals connected to the first conducting terminal of said first transistor and first conducting terminals of the first and second transistors are driven by the current device, second conducting terminal of said first transistor is connected to the ground and second conducting terminal of said second transistor is connected to the ground through a resistive device controlled by a predetermined voltage having a predetermined temperature coefficient.

The circuit further comprises a differential amplifier providing its output to the common control terminals of said plurality of transistors for ensuring a current flowing through said transistors such their second conducting terminals of these transistors are at same voltage level, the input terminals of the differential amplifier connected to second conducting terminals of said plurality of transistors to detect a voltage difference thereby providing an improved power supply rejection ratio.

In another embodiment, a circuit comprises a PTAT circuit for generating a reference voltage, an amplifier circuit coupled to receive and amplify the reference voltage and a reference current generator circuit outputting a current possessing a positive temperature coefficient and including a variable negative temperature coefficient resistance controlled responsive to the amplified reference voltage.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1 shows a conventional current reference;

FIGS. 2 and 2*a* show a current reference in accordance with U.S. Pat. No. 6,448,844;

DETAILED DESCRIPTION OF THE DRAWINGS

Figure 3:
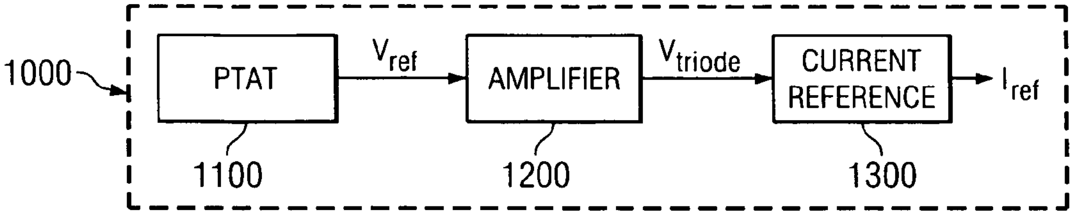
FIG. 3 shows a block diagram of the current reference in accordance with the present invention.

FIG. 3 shows a block diagram of the current reference circuit in accordance with the present invention. The current reference circuit 1000 has a Proportional To Absolute Temperature (PTAT) circuit 1100 for generating a reference voltage, connected to an amplifier 1200 which amplifies the reference voltage from circuit 1100 and provides it to a current reference generating block 1300. The first order temperature compensated reference current is then received from block 1300.

Figure 4:
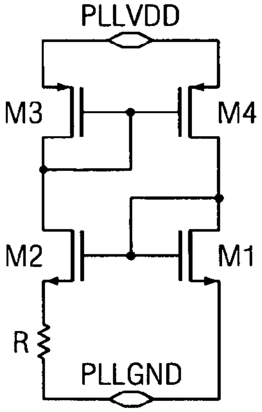
FIG. 4 shows a current device with a positive temperature coefficient.

FIG. 4 shows a current device with a positive temperature coefficient. This circuit has four MOS transistor M1, M2, M3 and M4. The transistors M1 and M2 have a common gate connected to the drain terminal of the transistor M1, similarly transistors M3 and M4 have a common gate terminal connected to the drain of transistor M3. Further transistors M3, M2 and a resistor R are connected in series between supply and ground and transistors M4 and M1 are connected in series as shown in the figure. The operation of the circuit can be understood as follows:

The transistors M3 and M4 form a current mirror circuit, and the gates of transistors M1 and M2 are at same voltage level hence a current I is forced to flow through the transistors M1 and M2. If $V_{gs1}$ and $V_{gs2}$ are the gate to source voltages of transistors M1 and M2 following mathematical expression can be written:

$$V_{gs1}=V_{gs2}+I*R$$

$$V_{gs1}=\sqrt{2*I/\beta_1}+V_{th1}$$

$$\text{where } \beta_1=\kappa_n(T)*(W/L)_1$$

$$\kappa_n(T)=\mu_n(T)*C_{ox}$$

$$\mu_n(T)=\mu_{n0}*T^{(-3/2)}$$

$$V_{gs2}=\sqrt{2*I/\beta_2}+V_{th2}$$

Where, $\beta_2=K\beta_1$ and K is the W/L ratio of the transistors.

Assuming that the threshold voltages $V_{th1}$ and $V_{th2}$ are the same, solving the above equations for current I results in the following expression:

$$I=(2/R^2*\beta_1)(1-1/\sqrt{K})^2$$

The resistor R has a negative temperature co-efficient and appears in the equation in the second order; hence, the current I has a positive temperature coefficient.

On differentiating the current equation with respect to temperature T the following expression for the temperature coefficient can be derived:

$$TC_I=-2*(1/R)*(\partial R/\partial T)-(1/\kappa_n(T))*(\partial\kappa_n(T)/\partial T)$$

The differentials of R and Kn are negative and there exists a negative sign in entire expression; hence, the temperature coefficient $TC_1$ is positive.

Further, the reference voltage is received from the gate of transistor M1 therefore on substituting for current I in the expression of gate to source voltage of the transistor M1 we get the following expression for reference voltage.

$$V_{gs1}=(2/(\beta_1*R))*(1-1/\sqrt{K})+V_{th1}$$

In the above expression the first term has a positive temperature coefficient whereas the threshold voltage $V_{th1}$ has a negative temperature coefficient indicating that the voltage $V_{gs1}$ has negative temperature coefficient. On differentiating voltage $V_{gs1}$ with respect to temperature the following expression is obtained:

$$\partial V_{gs1}/\partial T=-(2/(\beta_1*R))*(1-1/\sqrt{K})*((1/R)*(\partial R/\partial T)+(1/\kappa_n(T))*(\partial\kappa_n(T)/\partial T))+\partial V_{th}/\partial T$$

The above equation shows that $V_{gs1}$ can be temperature compensated to the first order.

Figure 5:
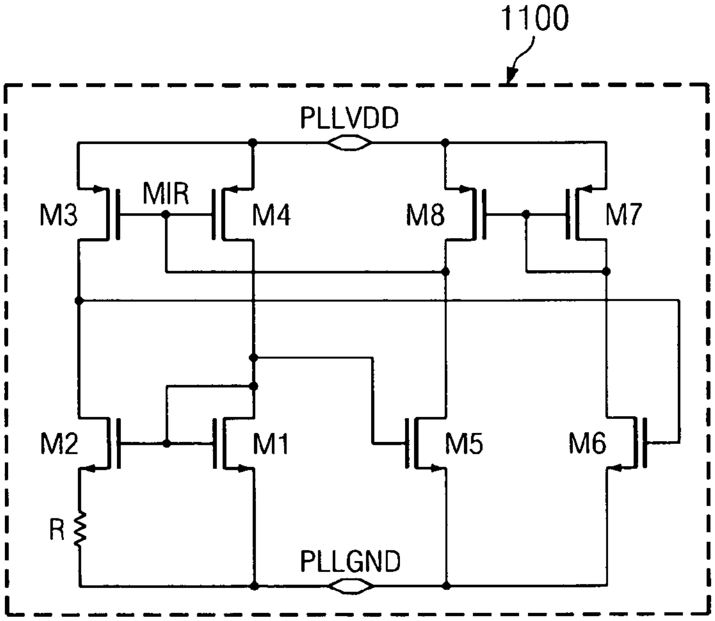
FIG. 5 shows a detailed circuit diagram of the Proportional To Absolute Temperature (PTAT) circuit.

We now discuss improving the Power Supply Rejection Ration (PSRR) of the current reference circuit. The variation in the current I in the any one of the branches of the PTAT circuit with respect to change in supply voltage Vdd can be written as:

$$\Delta i/\Delta V_{dd}=(1/\Gamma_{ds4})*[1/(G_{m2}*\Gamma_{ds4}*(1/g_{ml}))-g_{m4}*(1/g_{m3}))$$

Where the legends used in the equation have their commonly understood meaning. In some of applications the power supply rejection given by the above expression increases to a prohibitively large extent and is not desirable. To reduce the effect of power supply variation, the current device is provided with a differential amplifier as shown in FIG. 5. The circuit shown in the FIG. 5 forms a complete PTAT using circuit 1100 block of FIG. 3.

FIG. 5 has a differential amplifier comprising transistors M5, M6, M7 and M8. Transistors M5 and M6 are the input transistors that receive inputs at their control terminals from the drains of transistor M1 and M2 of the current device. Transistors M7 and M8 are current mirror transistors of the differential amplifier. The output of the differential amplifier is connected to the control terminals of the current controlling transistors M3 and M4 of the current device. The operation of the circuit is as follows:

The differential amplifier receives inputs from the current device and a proportionally amplified output is fed to the current device which forces a current to flow through the transistor M3 and M4 which keeps the drain of said transistors at the same voltage level.

For this circuit the PSRR equation reduces to $$\Delta i/\Delta V_{dd}=(1/g_{ml})/(A*g_{m2}*\Gamma_{ds2})$$

Where A is the gain of the differential amplifier. Often this circuit is provided with a charge tank connected to the output of the differential amplifier for starting up the circuit operation.

Figure 6:
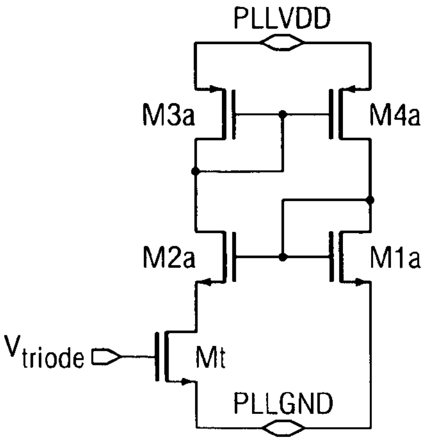
FIG. 6 shows a current device according to the present invention.

FIG. 6 shows a current device according to the present invention. The current device is the same as the current device shown in FIG. 4 except the resistor R has been replaced by transistor Mt. This circuit has MOS transistors M1$a$, M2$a$, M3$a$ M4$a$ and Mt. Transistors M1$a$ and M2$a$ have a common gate connected to the drain terminal of the transistor M1$a$, similarly transistors M3$a$ and M4$a$ have a common gate terminal connected to the drain of transistor M3$a$. Transistors M3$a$, M2$a$ and Mt are connected in series between supply and ground and transistors M4$a$ and M1$a$ are connected in series as shown in the figure. The control terminal of transistor Mt is supplied with a predetermined voltage that has a predetermined temperature coefficient so that the transistor operates in a predetermined operating region of its characteristics.

The function desired from transistor Mt is to provide a controlled resistance. The transistors show resistive properties in the linear region of its characteristics. If the transistor Mt can be supplied with a gate voltage such that it remains in the linear region of operation then transistor Mt will serve the same purpose as resistor R in FIG. 4. The advantage that is achieved by doing so is that such an arrangement will provide better controllability and first order temperature compensation.

Consider the voltage supplied at the gate of the transistor Mt has a profile similar to that derived for $V_{gs1}$ of FIG. 4, has positive temperature coefficient and is sufficient to keep the transistor in the linear region of the operation and is denoted by $V_{triode}$:

$$V_{triode}=(K1/(R*\beta)+K2*V_{th})$$

Further, for a transistor the effective resistance in the linear region $R_{lin}$ can be written as:

$$R_{lin}=1/(\beta_t*(V_{triode}-V_{th}))$$

On substituting for $V_{triode}$ and $R_{lin}$ in the current equation derived in the previous section, the following current equation is obtained.

$$I=(2/\beta_1)*(\beta_t*(K1/(R*\beta)+(K2-1)*V_{th})^2*(1-1/\sqrt{K})^2$$

Since $$\beta=\kappa_n*(W/L)$$

then the current equation reduces to:

$$I=(2/(\kappa_n*(W/L)_1)*(\kappa_n*(W/L)_t*(K1/(R*\kappa_n*(W/L))+(K2-1)*V_{th})^2*(1-1/\sqrt{K})^2$$

On rearranging the above equation:

$$I=(2/(W/L)_1)*((W/L)_t*(K1/(R*\sqrt{\kappa_n}*(W/L))+(K2-1)*V_{th}*\sqrt{\kappa_n})^2*(1-1/\sqrt{K})^2$$

The final current equation can be written as $$I=K_x*(K_y/(R*\sqrt{\kappa_n})+K_z*V_{th}*\sqrt{\kappa_n})^2$$

where, $$K_x=(2/(W/L)_1)*((W/L)_t*(1-1/\sqrt{K})^2$$

$$K_y=K1/(W/L)$$

$$K_z=K2-1$$

In this equation the term containing $K_y$ increases with temperature whereas the term containing $K_z$ reduces with an increase in the temperature. Therefore, the current generated by the circuit shown in the figure is first order temperature compensated.

The current reference circuit can be coupled to an amplifier in a similar manner as shown in FIG. 6 for reducing the effect of power supply variations, i.e., to improve Power Supply Rejection Ration (PSRR). For starting up the circuit operation a tank circuit can be attached to the control terminals of the transistors M3$a$ and M4$a$.

The invention can be tested by providing an appropriate voltage $V_{triode}$ at the gate of transistor Mt. According to one of the embodiments of the invention the stable voltage with positive temperature coefficient can be obtained from a PTAT circuit and then the voltage can be amplified by an amplifier to a level where it can drive transistor Mt in the desired operating region. A block diagram for such an implementation is shown in FIG. 3. Further, an explicit circuit diagram is shown in the FIG. 7.

Figure 7:
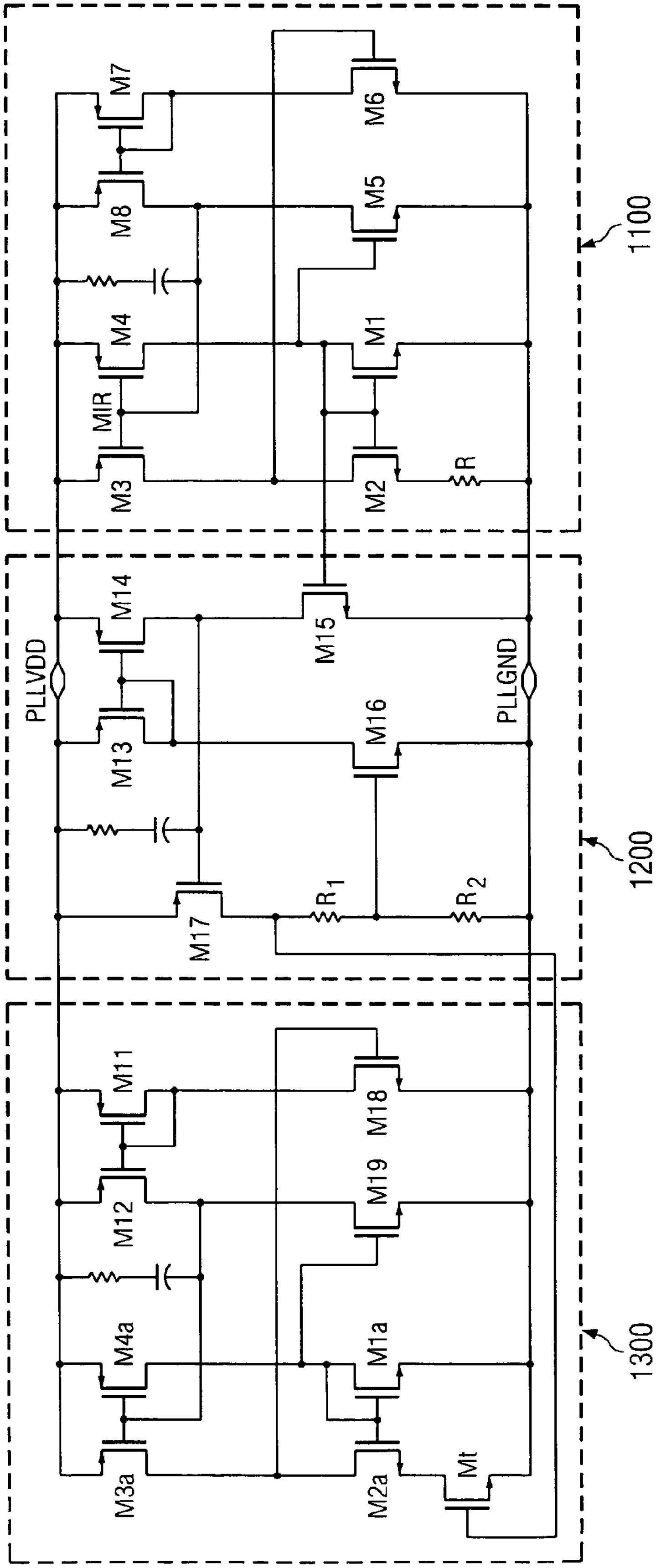
FIG. 7 shows a detailed circuit diagram of the current reference in accordance with the present invention.

In FIG. 7, an output voltage is obtained from the drain of the transistor M1 of the PTAT circuit 1100, which is than fed to an amplifier 1200. The amplifier 1200 comprises current mirroring transistors M13 and M14, input transistors M15 and M16 and a gain transistor M17. The grain transistor M17 is connected to ground through a potential divider comprising resistors R1 and R2. The drain of the transistor M17 provides an output voltage amplified by a factor A=(1+R1/R2). The output of the amplifier is fed to the gate of the transistor Mt of the current reference circuit 1300. The output current reference is obtained from the current device of the current reference circuit. Each of the circuits 1100, 1200 and 1300 are provided with a tank circuit comprising a resistor and a capacitor for initiating the circuits for operation.

The output obtained by above circuit is a first order temperature compensated output as evident from the previous discussion. However for the purpose of a clearer picture and proof a subsequent mathematical derivation is provided.

Referring to the previous discussion, the output of the PTAT circuit is $$V_{gs1}(2/(\beta_1*R))*(1-1/\sqrt{K})+V_{th1}$$

The input at the gate of the transistor Mt will be A times the PTAT output after amplification.

$$V_{triode}=A*(2/(\beta_1*R))*(1-1/\sqrt{K})+A*V_{th1}$$

The output current equation of the current reference circuit is given by $$I=(2/\beta_{1a})*(\beta_t*(V_{triode}-V_{th1a}))^2*(1-1/\sqrt{K})^2$$

$$\beta=\kappa_n*(W/L)$$

On substituting for $V_{triode}$, and assuming that the transistor M1 and M1$a$ are well matched and hence $V_{th1a}=V_{th}$, the expression obtained is as follows:

$$I=(2/(\kappa_n*(W/L)_{1a})*(\kappa_n*(W/L)_t*(A*(2/(\kappa_n*(W/L)_1*R))*(1-1/\sqrt{K})+(A-1)V_{th})^2*(1-1/\sqrt{K})^2$$

On rearranging, the following expression is obtained:

$$I=K_x*(K_y/(R*\sqrt{\kappa_n})+K_z*V_{th}*\sqrt{\kappa_n})^2$$

where, $$K_x=(2/(W/L)_1)*((W/L)_t*(1-1/\sqrt{K})^2$$

$$K_y=K1/(W/L)$$

$$K_z=K2-1$$

and where:

$$K1=(W/L)_t*(A*2*(1-1/\sqrt{K}))$$

$$K2=A$$

Now consider the following relations:

$$\kappa_n(T)=\mu_n(T)*C_{ox}$$

$$\mu_n(T)=\mu_{n0}*T^{(-3/2)}$$

and $$\sqrt{\kappa_n(T)} = \sqrt{(\mu_{n0}*C_{ox}*T^{(-3/2)})} = K_\mu * T^{(-3/4)}$$

such that $$\text{where } K_{82}=\sqrt{(\mu_{n0}*C_{ox})}$$

From the above relations the current equation reduces to:

$$I=K_{x\mu}*(K_{y\mu}*T^{(3/4)}/R+K_{z\mu}*V_{th}*T^{(-3/4)})^2$$

$$\text{where } K_{x\mu}=K_x*K_\mu$$

$$K_{y\mu}=K_y*K_\mu$$

$$K_{z\mu}=K_z*K_\mu$$

On differentiating with respect to temperature T:

$$\partial I/\partial T=2*K_{x\mu}*(K_{y\mu}*T^{(3/4)}/R+K_{z\mu}*V_{th}*T^{(-3/4)})*(K_{y\mu}*(3/4)*T^{(-1/4)}/R+(-K_{y\mu}*T^{(3/4)}/R)*(1/R)*(\partial R/\partial T)+K_{z\mu}*T^{(3/4)}\partial V_{th}/\partial T-(3/4)*K_{z\mu}*V_{th}*T^{(-7/4)})$$

From above equation it is clear that the current from this circuit is first order compensated.

Figure 8:
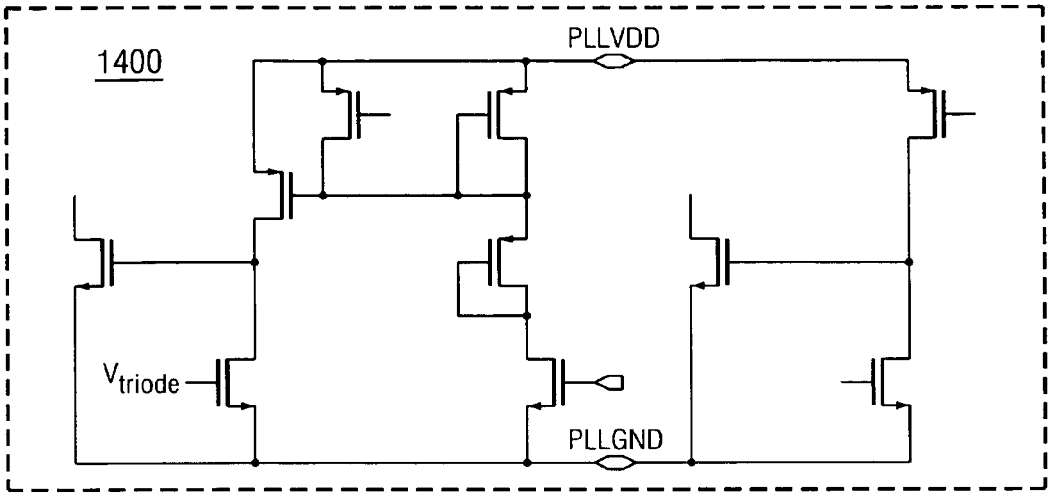
FIG. 8 shows a start up circuit.

FIG. 8 shows the startup circuit.

Figure 9:
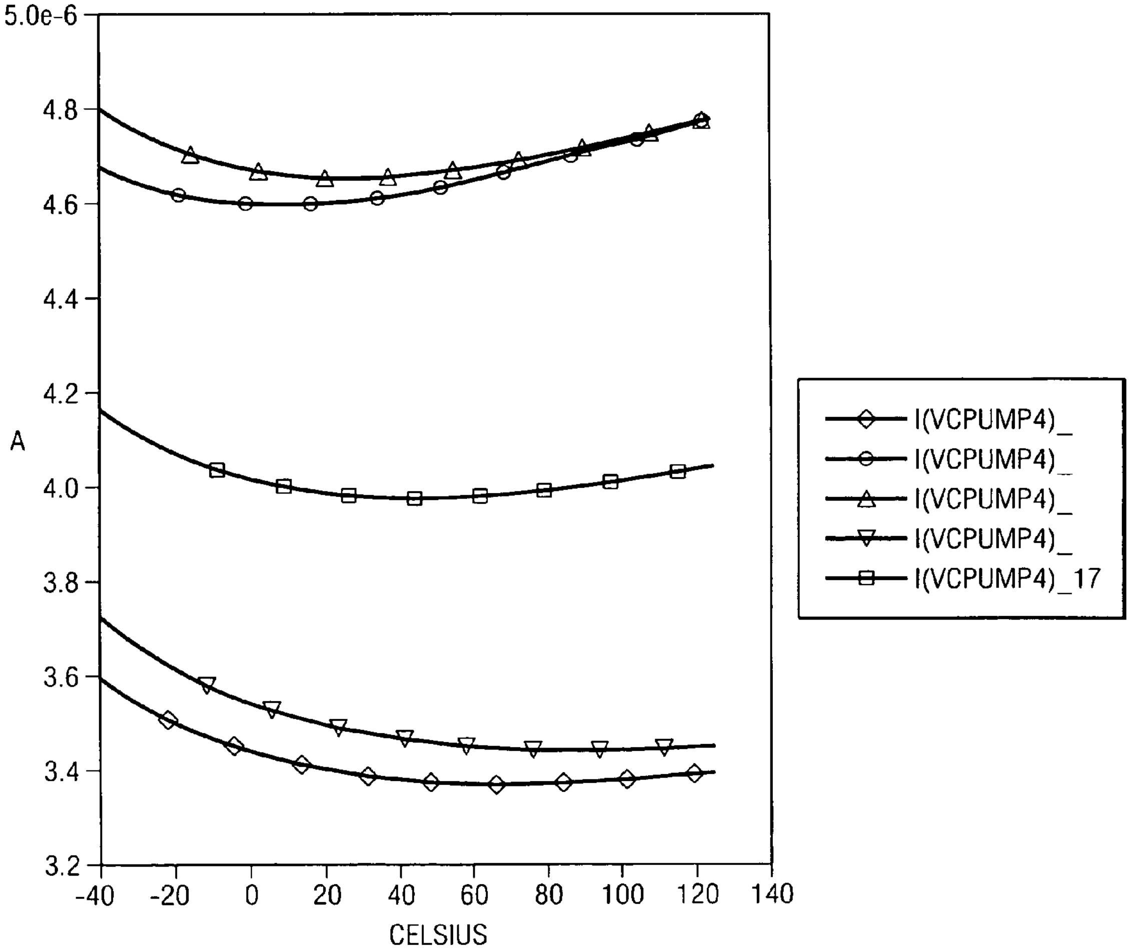
FIG. 9 shows a graphical representation of the experimental results obtained.

FIG. 9 shows a graphical representation of the simulation results. From the graph it is clear that the circuit shows better results than the conventional circuits.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A first order temperature compensated reference current generator comprising:

a current device providing a controlled current, wherein said current device is a current mirror circuit having a plurality of transistors with common control terminals with one of the conducting terminals connected to a supply terminal;

a differential amplifier providing its output to the common control terminals of said plurality of transistors for enabling a current through said transistors such that the second conducting terminals of these transistors are at the same voltage level, the input terminals of the differential amplifier being connected to the second conducting terminals of said plurality of transistors to detect a voltage difference thereby providing an improved power supply rejection ratio;

a startup circuit connected to said current device for initiating operation of said current device, the startup circuit comprising a tank circuit comprising a series connected resistor and capacitor, and a current definition mechanism driven by said current device for supplying a current which is independent of temperature, process and individual temperature coefficients circuit elements used;

wherein said current definition mechanism incorporates a voltage controlled resistor driven by a control voltage and having a certain temperature coefficient.

2. The generator as claimed in claim 1 wherein said start up circuit is connected to a first common control terminal of said plurality of transistors for providing a signal for a duration sufficient for initiating circuit operation.

3. The generator as claimed in claim 1 wherein said current definition mechanism includes first and second transistors having common control terminals connected to the first conducting terminal of said first transistor, first conducting terminals of said first and second transistors being driven by said current device, second conducting terminal of said first transistor being connected to the ground and second conducting terminal of said second transistor being connected to a supply terminal through a voltage-controlled resistive device driven by a predetermined voltage having a certain temperature coefficient.

4. The generator as claimed in claim 3 wherein said voltage-controlled resistive device is a transistor.

5. The generator as claimed in claim 3 wherein said predetermined voltage is a voltage signal sufficient enough to keep the resistive device linearly resistive.

6. The generator as claimed in claim 3 wherein said certain temperature coefficient is a positive temperature coefficient.

7. A circuit, comprising:

a PTAT circuit for generating a first reference voltage;

a differential amplifier circuit coupled to receive the first reference voltage at a first differential input and a second reference voltage at a second differential input, the differential amplifier circuit generating an amplified reference voltage; and a reference current generator circuit outputting a current possessing a positive temperature coefficient and including a variable negative temperature coefficient resistance controlled responsive to the amplified reference voltage;

wherein the reference current generator circuit comprises:

a first transistor having first and second conduction terminals and a first control terminal, the first conduction terminal of the first transistor coupled to a first supply reference voltage;

a second transistor having first and second conduction terminals and second control terminal, the first and second control terminals coupled to each other and the second conduction terminal of the first transistor;

a third transistor having first and second conduction terminals and a third control terminal, the first conduction terminal of the third transistor coupled to a second supply reference voltage and the second conduction terminal of the third transistor coupled to the second conduction terminal of the first transistor;

a fourth transistor having first and second conduction terminals and a fourth control terminal, the first conduction terminal of the fourth transistor coupled to the second reference voltage and the second conduction terminal of the fourth transistor coupled to the second conduction terminal of the second transistor, and the third and fourth control terminals coupled to each other and the second conduction terminal of the fourth transistor; and a fifth transistor having first and second conduction terminals and a fifth control terminal, the first conduction terminal of the fifth transistor coupled to the first supply reference voltage and the second conduction terminal of the fifth transistor coupled to the first conduction terminal of the second transistor.

8. The circuit of claim 7 wherein the variable negative temperature coefficient resistance is configured as a transistor having its control terminal coupled to receive the amplified reference voltage.

9. The circuit of claim 8 wherein the transistor is a MOS transistor.

10. The circuit of claim 8 wherein the amplified reference voltage is controlled by the PTAT circuit and differential amplifier circuit to lie within a linear operation region of the transistor.

11. The circuit of claim 7 wherein the generator circuit generated current is first order temperature compensated.

12. The circuit of claim 7 wherein the fifth control terminal receives the amplified reference voltage which sets the fifth transistor to operate in a linear region.

13. The circuit of claim 7 wherein the circuit generates a current possessing a positive temperature coefficient and the fifth transistor operates as a variable negative temperature coefficient resistance controlled responsive to the amplified reference voltage.

14. The circuit of claim 7 wherein the circuit generates a current that is first order temperature compensated.

15. The circuit of claim 7 wherein the differential amplifier comprises a voltage divider receiving the amplified reference voltage and generating therefrom the second reference voltage.

16. The circuit of claim 15 wherein the differential amplifier includes a first differential output and a transistor having a source/drain path connected in series with the voltage divider and a gate terminal coupled to the first differential output.

* * * * *